United States Patent
Lo et al.

(10) Patent No.: US 9,653,173 B1
(45) Date of Patent: May 16, 2017

(54) MEMORY CELL WITH DIFFERENT PROGRAM AND READ PATHS FOR ACHIEVING HIGH ENDURANCE

(71) Applicant: eMemory Technology Inc., Hsin-Chu (TW)

(72) Inventors: Chun-Yuan Lo, Taipei (TW); Wei-Chen Chang, Kaohsiung (TW); Shih-Chen Wang, Taipei (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 15/368,658

(22) Filed: Dec. 4, 2016

Related U.S. Application Data

(60) Provisional application No. 62/280,683, filed on Jan. 19, 2016.

(51) Int. Cl.
    *G11C 11/34* (2006.01)
    *G11C 16/16* (2006.01)
    *G11C 16/26* (2006.01)
    *G11C 16/10* (2006.01)
    *H01L 23/528* (2006.01)
    *H01L 27/02* (2006.01)
    *H01L 27/11517* (2017.01)

(52) U.S. Cl.
    CPC .............. *G11C 16/16* (2013.01); *G11C 16/10* (2013.01); *G11C 16/26* (2013.01); *H01L 23/528* (2013.01); *H01L 27/0207* (2013.01); *H01L 27/11517* (2013.01)

(58) Field of Classification Search
    CPC ......... G11C 16/16; G11C 16/10; G11C 16/26; H01L 23/528; H01L 27/0207; H01L 27/11517
    USPC ............ 365/185.05, 185.01, 185.18, 185.26, 365/185.29, 45, 51, 63, 149, 188
    See application file for complete search history.

(56) References Cited

U.S. PATENT DOCUMENTS

| | | | |
|---|---|---|---|
| 6,963,503 B1 | 11/2005 | Rahim | |
| 7,483,310 B1 * | 1/2009 | Bu | G11C 16/0416 257/314 |
| 7,968,926 B2 | 6/2011 | Huang | |
| 9,496,417 B2 * | 11/2016 | Lu | H01L 27/11524 |

FOREIGN PATENT DOCUMENTS

EP            2854136 A1     4/2015

* cited by examiner

*Primary Examiner* — Fernando Hidalgo
(74) *Attorney, Agent, or Firm* — Winston Hsu; Scott Margo

(57) ABSTRACT

A memory cell includes a coupling device, a read transistor, a first read selection transistor, a second read selection transistor, an erase device, a program transistor, and a program selection transistor. The coupling device is formed on a first doped region. The erase device is formed on a second doped region. The read transistor, the first read selection transistor, the second read selection transistor, the program transistor, and the program selection transistor are formed on a third doped region. A gate terminal of the coupling device is coupled to a common floating gate. A gate terminal of the erase device is coupled to the floating gate. During a program operation, electrical charges are moved from the common floating gate. During an erase operation, electrical charges are ejected from the common floating gate to the erase device.

25 Claims, 9 Drawing Sheets

MEMORY CELL WITH DIFFERENT PROGRAM AND READ PATHS FOR ACHIEVING HIGH ENDURANCE

CROSS REFERENCE TO RELATED APPLICATIONS

This application claims the benefit of U.S. provisional application No. 62/280,683, filed Jan. 19, 2016.

BACKGROUND OF THE INVENTION

1. Field of the Invention

The present invention illustrates a memory cell, and more particularly, a memory cell with different program and read paths for achieving high endurance.

2. Description of the Prior Art

Non-volatile memory is a type of memory that retains information it stores even when no power is supplied to memory blocks. Some examples include magnetic devices, optical discs, flash memory, and other semiconductor-based memory topologies. Non-volatile memory can be categorized in electrically addressed systems (i.e., read-only memory) and mechanically addressed systems (i.e., hard disks, optical disc, magnetic tape, holographic memory, and such). Specifically, since non-volatile memory does not require its memory data to be periodically refreshed, it is commonly used for secondary storage or long-term consistent storage.

Generally, with advancement of techniques, a high density or high capacity-based non-volatile memory is required to facilitate big data accessibility. Since the non-volatile memory can perform read operation and program operation, endurance count is increased over time. In conventional non-volatile memory, when the endurance count becomes large, the transconductance degradation (say, Gm degradation) is severe, leading to erase current degradation (say, ERS Ion degradation). In other words, in conventional non-volatile memory, high endurance count causes ERS Ion degradation and thus decreases the sensor margin. As a result, operation performance of the conventional non-volatile memory is rapidly reduced over time.

SUMMARY OF THE INVENTION

In an embodiment of the present invention, a memory cell comprises a coupling device, a read transistor, a first read selection transistor, a second read selection transistor, an erase device, a program transistor, and a program selection transistor. The coupling device comprises a first terminal configured to receive a control line signal, and a second terminal. The read transistor comprises a first terminal, a control terminal coupled to the second terminal of the coupling device, and a second terminal. The first read selection transistor comprises a first terminal coupled to the second terminal of the read transistor, a control terminal configured to receive a word line signal, and a second terminal configured to receive a bit line signal. The second read selection transistor comprises a first terminal configured to receive a read source line signal, a control terminal configured to receive a read select gate signal, and a second terminal coupled to the first terminal of the read transistor. The erase device comprises a first terminal configured to receive an erase line signal, and a second terminal coupled to the second terminal of the coupling device. The program transistor comprises a first terminal, and a control terminal coupled to the second terminal of the coupling device. The program selection transistor comprises a first terminal configured to receive a program source line signal, a control terminal configured to receive a program select gate signal, and a second terminal coupled to the first terminal of the program transistor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
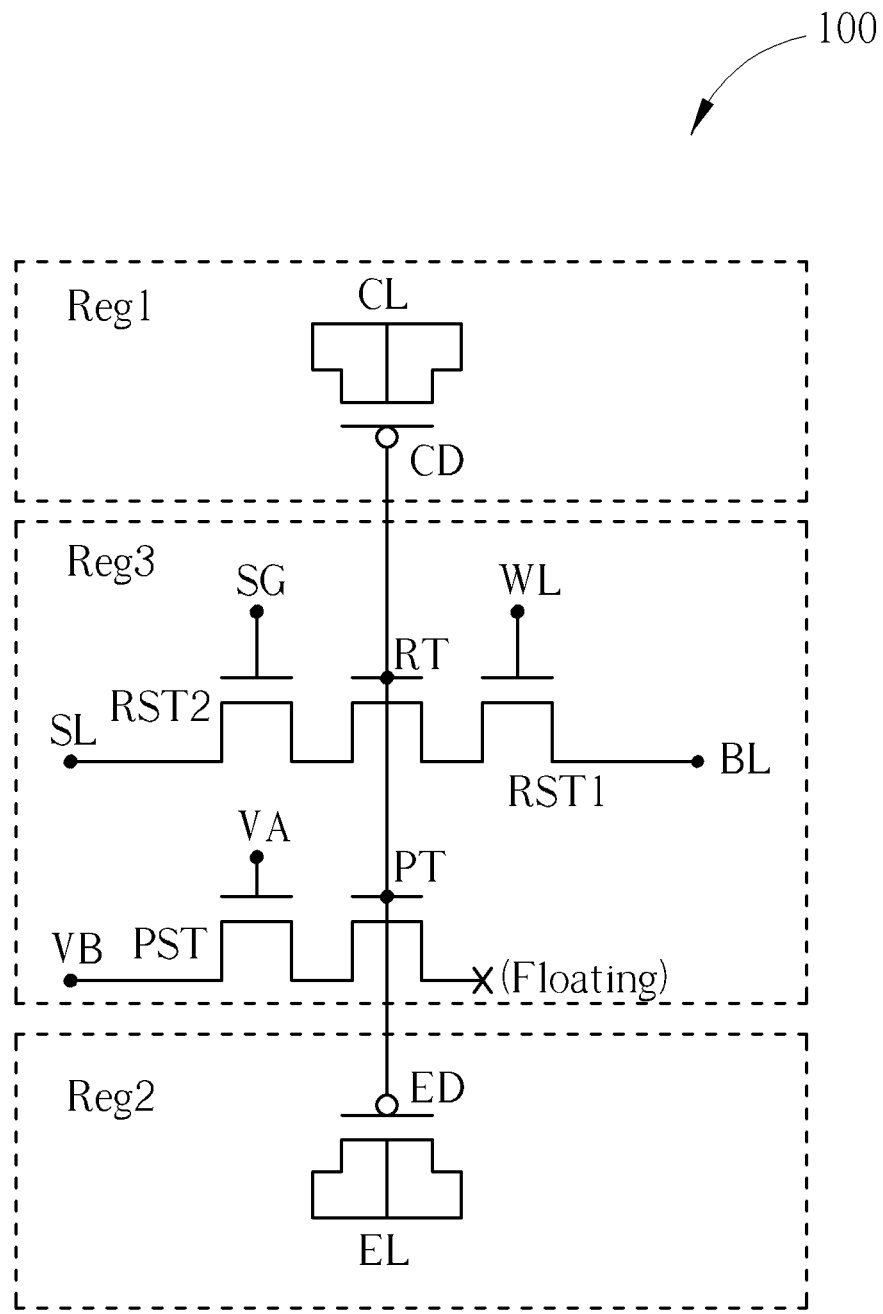
FIG. 1 illustrates a circuit structure of a memory cell according to an embodiment of the present invention.

FIG. 1 illustrates a circuit structure of a memory cell 100. The memory cell 100 includes a coupling device CD, a read transistor RT, a first read selection transistor RST1, a second read selection transistor RST2, an erase device ED, a program transistor PT, and a program selection transistor PST. The coupling device CD includes a first terminal for receiving a control line signal CL, and a second terminal. The second terminal can be a gate portion of the coupling device CD. The read transistor RT includes a first terminal, a control terminal coupled to the second terminal of the coupling device CD, and a second terminal. The first read selection transistor RST1 includes a first terminal coupled to the second terminal of the read transistor RT, a control terminal for receiving a word line signal WL, and a second terminal for receiving a bit line signal BL. The second read selection transistor RST2 includes a first terminal for receiving a read source line signal SL, a control terminal for receiving a read select gate signal SG, and a second terminal coupled to the first terminal of the read transistor RT. The erase device ED includes a first terminal for receiving an erase line signal EL, and a second terminal coupled to the second terminal of the coupling device CD. The program transistor PT includes a first terminal, a control terminal coupled to the second terminal of the coupling device CD, and a second terminal kept floated. The program selection transistor PST includes a first terminal for receiving a program source line signal VB, a control terminal for receiving a program select gate signal VA, and a second terminal coupled to the first terminal of the program transistor PT. Specifically, the coupling device CD is formed on a first doped region Reg1. The erase device ED is formed on a second doped region Reg2. The read transistor RT, the first read selection transistor RST1, the second read selection transistor RST2, the program transistor PT, and the program selection transistor PST are formed on a third doped region Reg3. Specifically, in the memory cell 100, the first doped region Reg1 can be an N well. The second doped region Reg2 can be an N well. The third doped region Reg3 can be a P well. Further, the first doped region Reg1 and the second doped region Reg2 are two respective doped regions. The read transistor RT and the program transistor PT can be two floating gate transistors. The coupling device CD and the erase device ED can be two metal oxide semiconductor (MOS) capacitors. The second terminal of the coupling device CD, the second terminal of the erase device ED, the floating gates of the read transistor RT and the program transistor PT are coupled to a common floating gate. Instead of using a common path for performing read operation and program operation, the memory cell 100 uses different program path and read path for achieving high endurance. For presentation completeness, several operations of the memory cell 100 are illustrated below.

Figure 2:
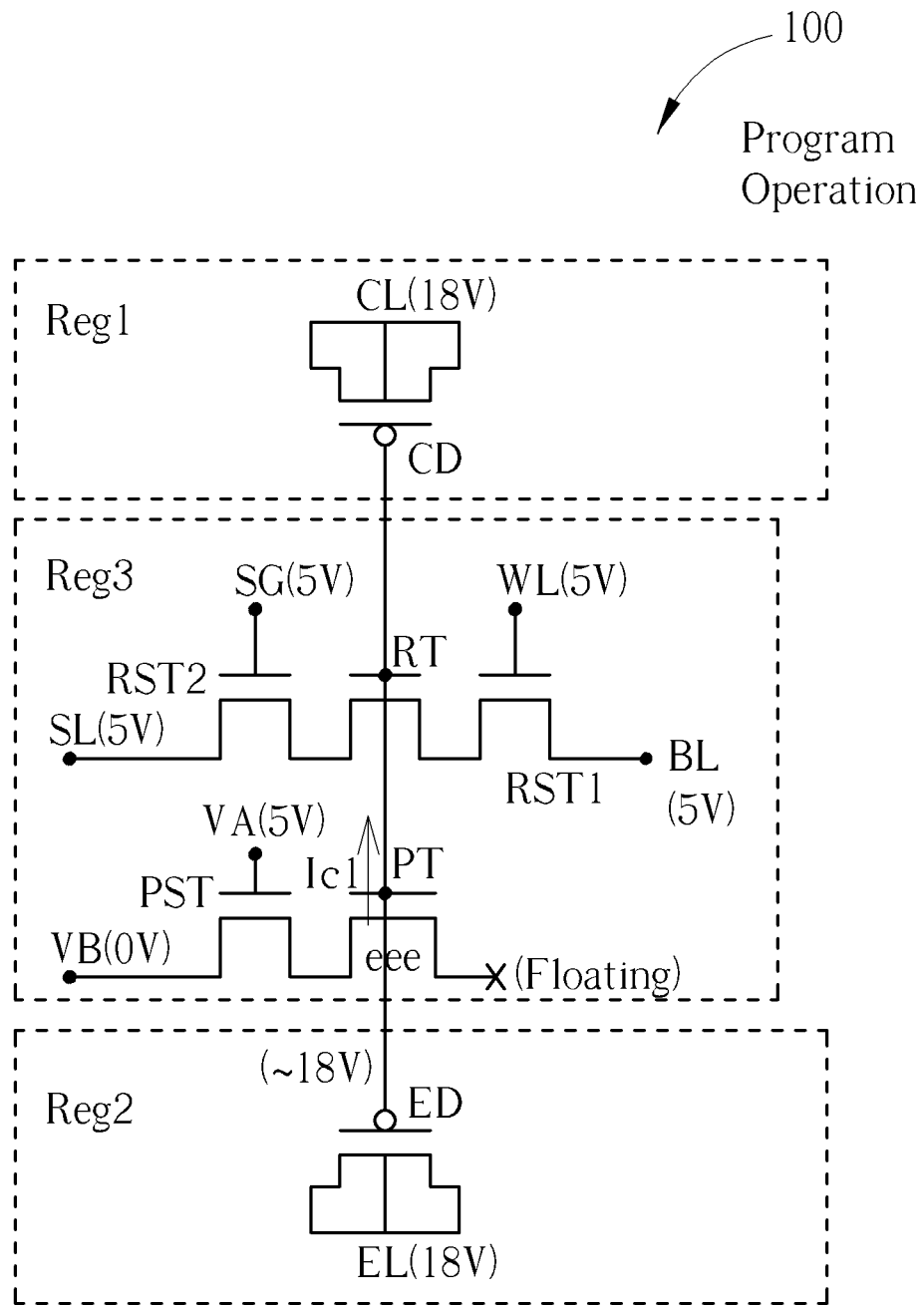
FIG. 2 illustrates a program operation of the memory cell in FIG. 1.

FIG. 2 illustrates a program operation of the memory cell 100. In the embodiment, during the program operation of the memory cell 100, the control line signal CL is at a first voltage VPGM equal to 18 volts. The read source line signal SL is at a second voltage VDD equal to 5 volts. The read select gate signal SG is at the second voltage VDD equal to 5 volts. The word line signal WL is at the second voltage VDD equal to 5 volts. The bit line signal BL is at the second voltage VDD equal to 5 volts. The erase line signal EL is at the first voltage VPGM equal to 18 volts. The program select gate signal VA is at the second voltage VDD equal to 5 volts. The program source line signal VB is at a ground voltage equal to 0 volts. A voltage of the third doped region Reg3 is equal to 0 volts. Since a cross voltage between the first terminal and the second terminal of the erase device ED is substantially equal to 0 volts, no electrical charges are ejected from the second terminal (i.e., coupled to a common floating gate) to the first terminal of the erase device ED. However, since a cross voltage between a source and a gate terminal (i.e., Vgs) of the program selection transistor PST is substantially equal to 5 volts, the program selection transistor PST is turned ON. As a result, since the program selection transistor PST is conductive, a voltage of the first terminal and a voltage of the second terminal of the program selection transistor PST are equal to 0 volts. By doing so, since a side of floating gate receives a bias voltage close to 18 volts and the source/drain region of the program transistor PT has a voltage equal to 0 volts, a flow of electrical charges Ic1 are injected from the program transistor PT to the floating gate by a Fowler-Nordheim tunneling (FN tunneling) mechanism.

Figure 3:
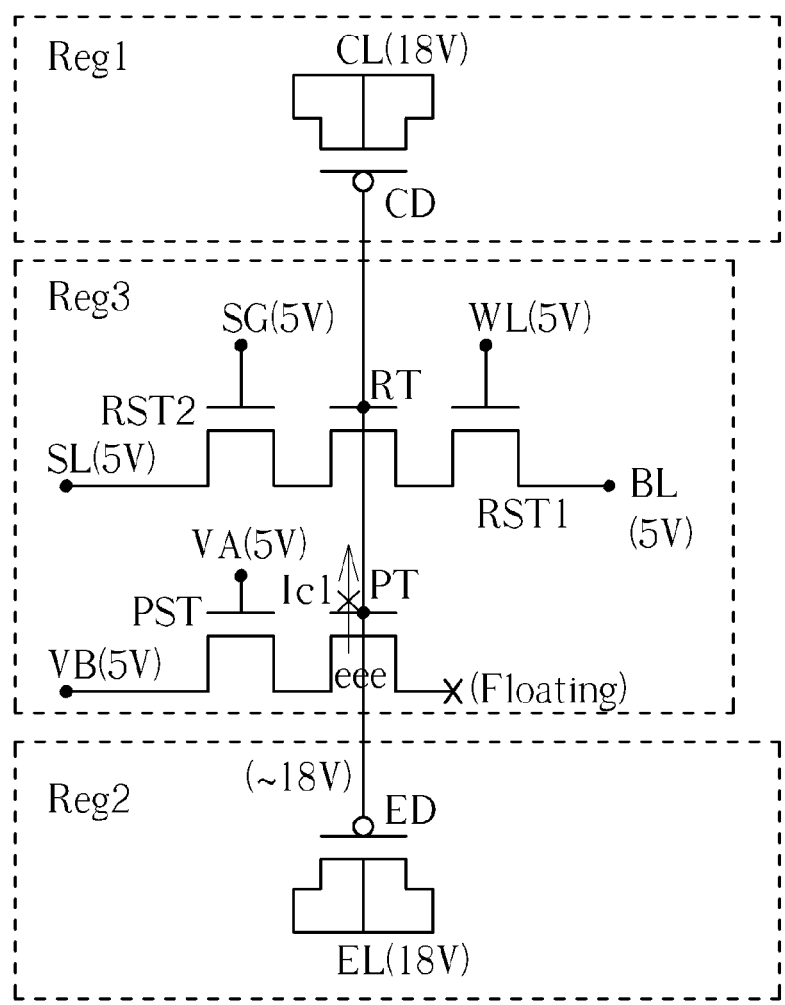
FIG. 3 illustrates a program inhibition operation of the memory cell in FIG. 1.

FIG. 3 illustrates a program inhibition operation of the memory cell 100. In the embodiment, during the program inhibition operation of the memory cell 100, voltages of the control line signal CL, the read source line signal SL, the read select gate signal SG, the word line signal WL, the bit line signal BL, the erase line signal EL, and the program select gate signal VA are similar to the program operation of the memory cell 100. Thus, operational states of the first read selection transistor RST1, the second read selection transistor RST2, the read transistor RT, and the erase device ED are similar to the program operation of the memory cell 100. However, the program source line signal VB is at the second voltage VDD equal to 5 volts. As a result, since a cross voltage between a source and a gate terminal (i.e., Vgs) of the program selection transistor PST is substantially equal to 0 volts, the program selection transistor PST is turned OFF. The channel voltage of the program transistor PT will be boosted to a specific voltage level which is at 60%~80% voltage of the control line signal CL (18V), the electrical field across the gate oxide of the program transistor PT is not enough to trigger FN tunneling, the memory cell 100 is regarded as an unselected memory cell and thus operated under a programmed inhibited state.

Figure 4:
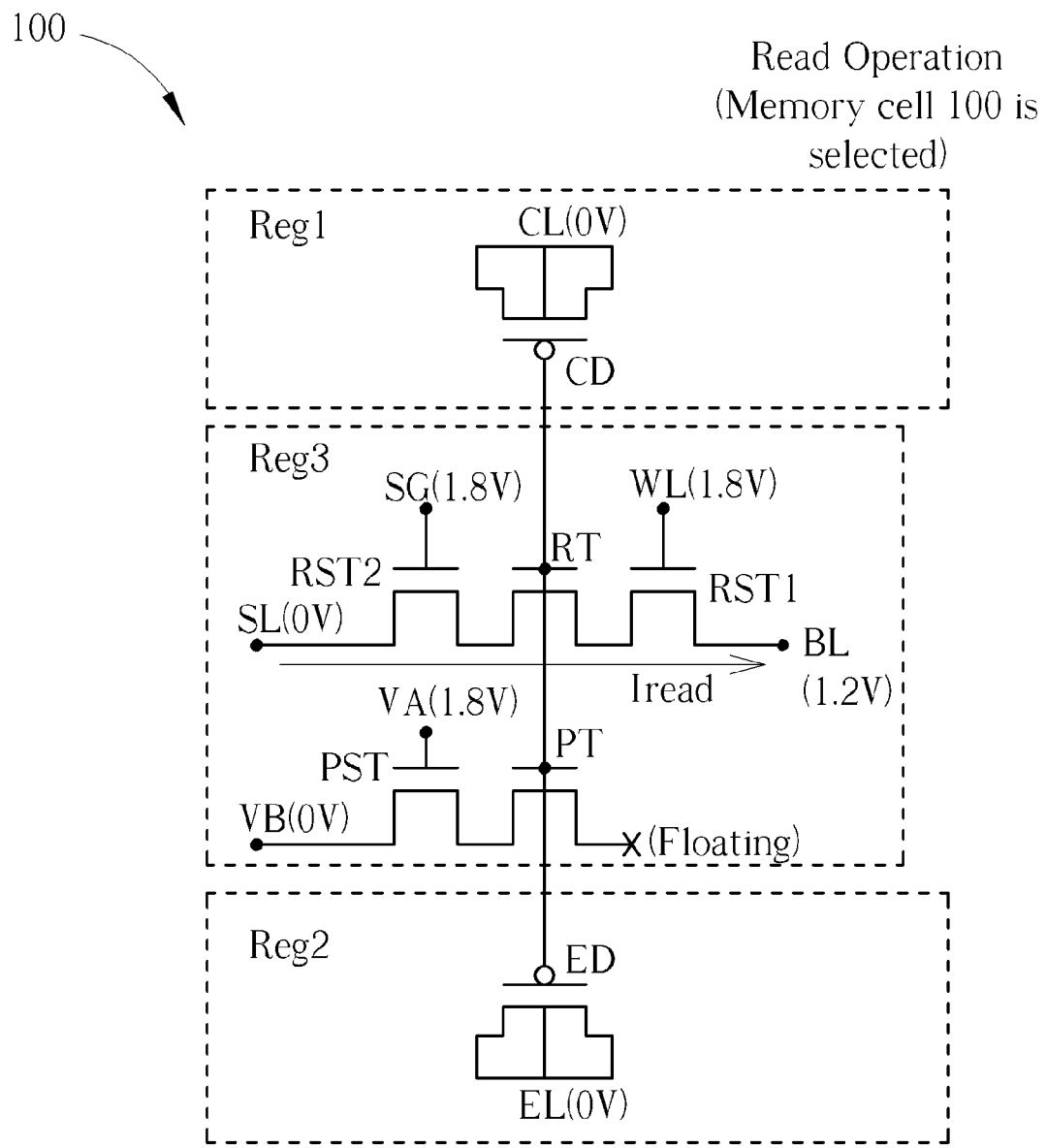
FIG. 4 illustrates a read operation when the memory cell in FIG. 1 is selected.

FIG. 4 illustrates a read operation when the memory cell 100 is selected. In the embodiment, the operation of the memory cell 100 is illustrated below. The control line signal CL is at the ground voltage equal to 0 volts. The read source line signal SL is at the ground voltage equal to 0 volts. The read select gate signal SG is at a third voltage VG equal to 1.8 volts. The word line signal WL is at the third voltage VG equal to 1.8 volts. The bit line signal BL is at a fourth voltage VBL equal to 1.2 volts. The erase line signal EL is at the ground voltage equal to 0 volts. The program select gate signal VA is at the third voltage VG equal to 1.8 volts. The program source line signal VB is at the ground voltage equal to 0 volts. A voltage of the third doped region Reg3 is equal to 0 volts. Under the above bias conditions, the first read selection transistor RST1 and the second read selection transistor RST2 are turned ON, a read current Iread may be generated. In other words, during the read operation, intensity of the read current Iread depends on the amount of electric charges stored in the common floating gate. In another embodiment, the program select gate signal VA, the read select gate signal SG, and the word line signal WL can be jointly connected since they required the same voltage level equal to the third voltage VG (i.e., 1.8 volts in the embodiment).

Figure 5:
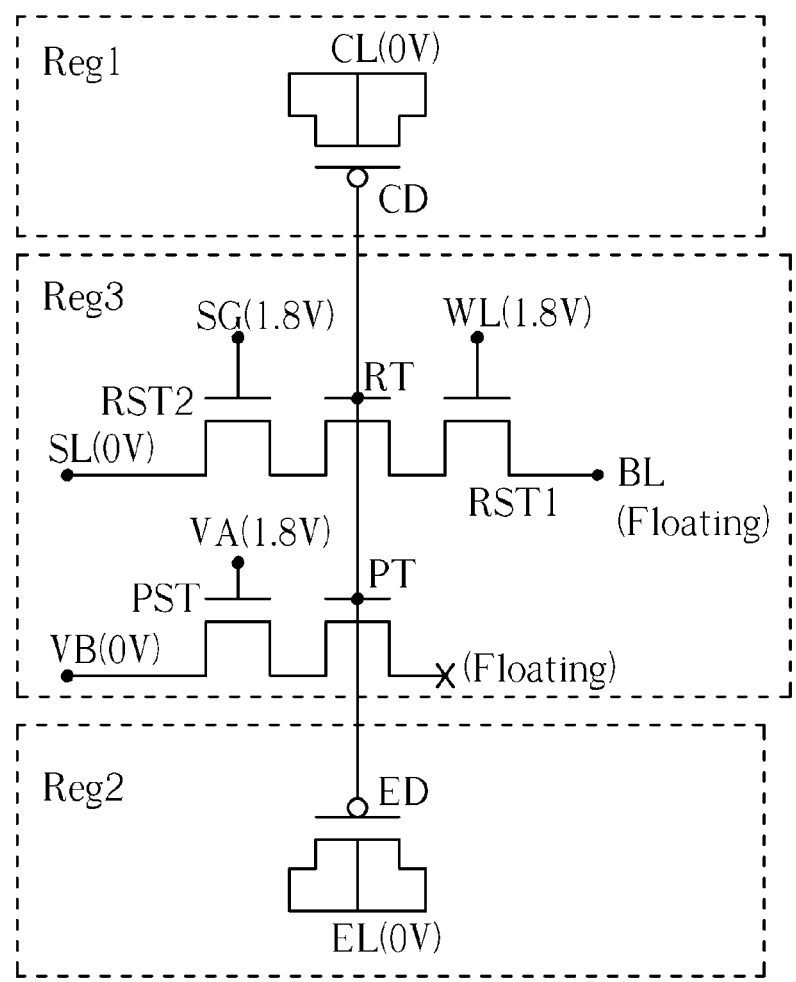
FIG. 5 illustrates a read operation when the memory cell in FIG. 1 is unselected.

FIG. 5 illustrates a read operation when the memory cell 100 is unselected. In the embodiment, voltages of the control line signal CL, the read source line signal SL, the read select gate signal SG, the word line signal WL, the erase line signal EL, the program select gate signal VA, and the program source line signal VB are similar to the read operation when the memory cell 100 is selected. Thus, operational states of the erase device ED, the program transistor PT, and the program selection transistor PST are similar to the read operation of the memory cell 100. However, the bit line signal BL is under a floating state. Thus, no read current is generated from the second read selection transistor RST2 to the first read selection transistor RST1.

Figure 6:
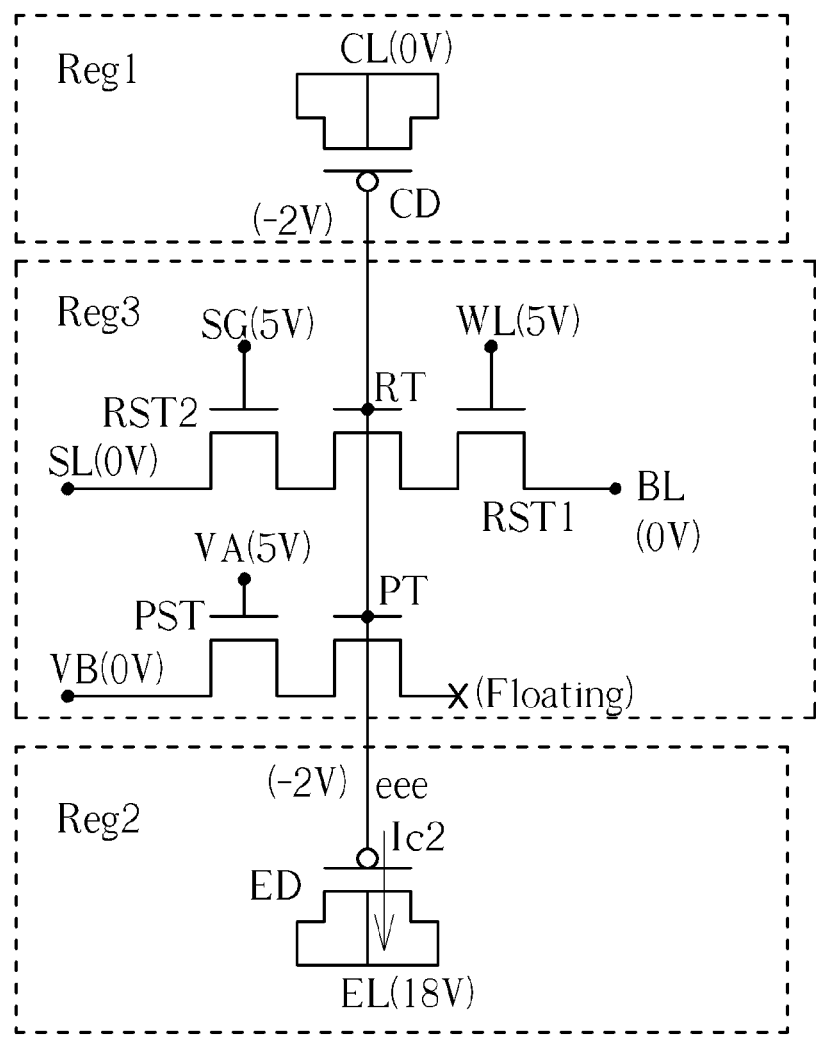
FIG. 6 illustrates an erase operation of the memory cell in FIG. 1.

FIG. 6 illustrates an erase operation of the memory cell 100. In the embodiment, during the erase operation of the memory cell 100, the control line signal CL is at the ground voltage equal to 0 volts. The read source line signal SL is at the ground voltage equal to 0 volts. The read select gate signal SG is at the second voltage VDD equal to 5 volts. The word line signal WL is at the second voltage VDD equal to 5 volts. The bit line signal BL is at the ground voltage equal to 0 volts. The erase line signal EL is at a fifth voltage VERS equal to 18 volts. The program select gate signal VA is at the second voltage VDD equal to 5 volts. The program source line signal VB is at the ground voltage equal to 0 volts. Here, since cross voltages between gate terminals and source terminals (i.e., Vgs) of the first read selection transistor RST1, the second read selection transistor RST2, and the program selection transistor PST are high enough, the first read selection transistor RST1, the second read selection transistor RST2, and the program selection transistor PST are turned ON. Thus, the source/drain regions of the program transistor PT and the read transistor RT receive voltages equal to 0 volts. However, since the erase operation is performed after completing the program operation, the floating gate holds electrical charges initially during the erase operation. Thus, a voltage of the second terminal of the coupling device CD depends on a voltage of control line signal CL and the electrical charges hold by the floating gate. For example, the voltage of the second terminal of the coupling device CD is equal to −2 volts. As aforementioned illustration, when the first read selection transistor RST1, the second read selection transistor RST2, and the program selection transistor PST are turned ON, the source/drain regions of the program transistor PT and the read transistor RT are at a voltage equal to 0 volts. Thus, channels formed on the well of the program transistor PT and the read transistor RT are at the voltage equal to 0 volts. Thus, no tunneling process is triggered (i.e., no electrical charges are moved to the floating gate) of the program transistor PT since a cross voltage between a side of floating gate and the channel of the program transistor PT is not enough high. Similarly, no tunneling process is triggered of the read transistor RT since a cross voltage between the side of floating gate and the channel of the read transistor RT is not enough high. However, since the first terminal of the erase device ED receives a voltage equal to 18 volts, a cross voltage between the first terminal and the second terminal of the erase device ED is equal to 20 volts. Thus, the tunneling process of the erase device ED is triggered. A flow of the electrical charges Ic2 are ejected from the common floating gate to the first terminal of the erase device ED.

Briefly, the memory cell 100 can perform several operations, such as the program operation, the program inhibition operation, the read operations when the memory cell 100 is selected or unselected, and the erase operation. During the program operation, the first terminal of the coupling device CD receives a high voltage, the program selection transistor PST is turned ON, and the electrical charges are injected through the program transistor PT to the common floating gate. During the erase operation, the first terminal of the erase device ED receives a high voltage and the electrical charges are ejected from the common floating gate to the erase device ED. During the read operation of the memory cell 100 being selected, the first read selection transistor RST1 and the second read selection transistor RST2 are turned ON so that the current Iread can be detected to identify the amount of electric charges stored in the common floating gate (i.e., the state of the memory cell 100). Specifically, the program and the read paths are different in the memory cell 100 (or say, through different transistors). Under program operation, the path is mainly operated through the program transistor PT. Under the read operation, the path is mainly operated through the read transistor RT. As a result, since the read transistor RT is not continuously stressed during the program and erase operations, there is less degradation in the read transistor RT. As a result, the memory cell 100 can provide high endurance. For simplicity, all aforementioned operations of the memory cell 100 can be illustrated in Table A. The "PGM" is denoted as the program operation. The "PGMI" is denoted as the program inhibition operation. The "ERS" is denoted as the erase operation. The "READ" is denoted as the read operation when the memory cell 100 is selected. The "READI" is denoted as the read operation when the memory cell 100 is unselected. "F" is denoted as the floating state.

TABLE A

| Mode | CL | SL | SG | WL | BL | EL | VA | VB |
|---|---|---|---|---|---|---|---|---|
| PGM | VPGM | VDD | VDD | VDD | VDD | VPGM | VDD | 0 |
| PGMI | VPGM | VDD | VDD | VDD | VDD | VPGM | VDD | VDD |
| ERS | 0 | 0 | VDD | VDD | 0 | VERS | VDD | 0 |
| READ | 0 | 0 | VG | VG | VBL | 0 | VG | 0 |
| READI | 0 | 0 | VG | VG | F | 0 | VG | 0 |

Each signal of the memory cell 100 can be illustrated in Table A for performing various operations. However, voltages of the signals received by the memory cell 100 can be reasonably modified within a predetermined range. For example, the first voltage VPGM can be selected from a range of 7 volts to 24 volts. The second voltage VDD can be selected from a range of 1.2 volts to 6.6 volts. The third voltage VG can be selected from a range of 1.2 volts to 6.6 volts. The fourth voltage VBL can be selected from a range of 0.8 volts to 2.5 volts. The fifth voltage VERS can be selected from a range of 7 volts to 24 volts. Further, the control line signal CL and the erase line signal EL can also be at a sixth voltage during the read operation when the memory cell 100 is selected. Note that the sixth voltage can be equal to or greater than the ground voltage. Further, the control line signal CL and the erase line signal EL can be at the sixth voltage in conjunction with the bit line signal BL being at a seventh voltage during the read operation when the memory cell 100 is unselected. Note that the seventh voltage is equal to or in between the third voltage VG and the ground voltage. All reasonable voltage modifications fall into the scope of the present invention.

Figure 7:
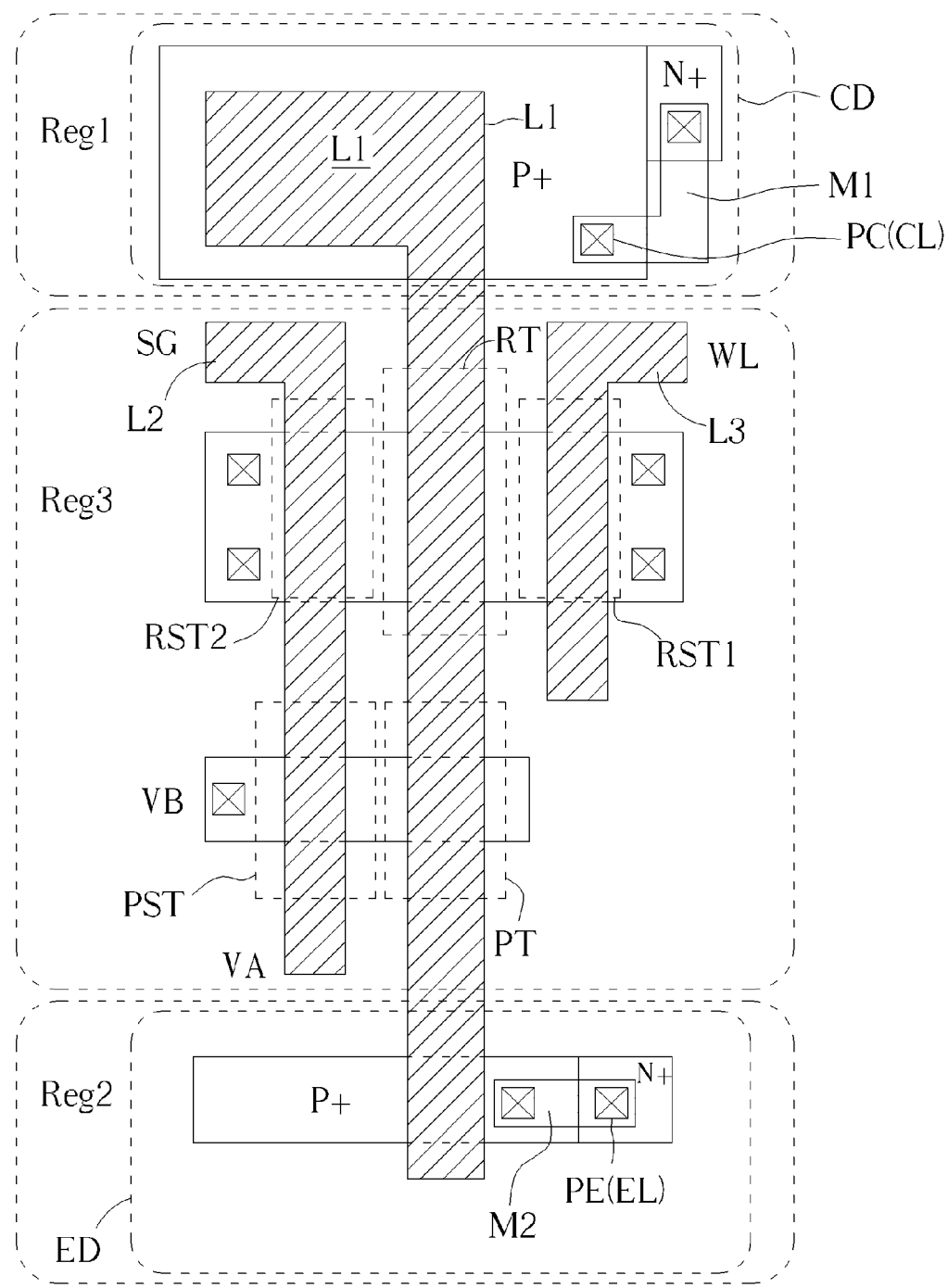
FIG. 7 illustrates a layout structure of the memory cell in FIG. 1.

FIG. 7 illustrates a layout structure of the memory cell 100. As shown in FIG. 7, the coupling device CD is formed on a first doped region Reg1. The erase device ED is formed on a second doped region Reg2. The read transistor RT, the first read selection transistor RST1, the second read selection transistor RST2, the program transistor PT, and the program selection transistor PST are formed on a third doped region Reg3. The read transistor RT and the program transistor PT are floating gate transistors. A layer L1, a layer L2, and a layer L3 can be three polycrystalline silicon layers. The layer L1 in the memory cell 100 is a floating gate layer coupled to a gate of the coupling device CD, a gate of the erase device ED, a gate of the read transistor RT, and a gate of the program transistor PT. Specifically, in the coupling device CD, no bias voltage is directly received by the layer L1 (hereafter, say "the floating layer L1"). Here, doping profile of P+ region and N+ region butted by a metal layer M1 are implanted on the first doped region Reg1. The control line signal CL is inputted to the coupling device CD through a contact PC. In the second read selection transistor RST2 and the program selection transistor PST, gate terminals (i.e., control terminals) can be implemented by a common polycrystalline silicon layer (i.e., the layer L2) since the gate terminals of the second read selection transistor RST2 and the program selection transistor PST receive the same signals for all operations. It is obtained that the read select gate signal SG and the program select gate signal VA in Table A are identical for all operations. A source/drain junction of the program transistor PT is coupled to a source/drain junction of the program selection transistor PST. In the erase device ED, similarly, doping profile of P+ region and N+ region butted by a metal layer M2 are implanted on the second doped region Reg2. The erase line signal EL is received by the erase device ED though a contact PE. However, the layout structure of the memory cell 100 is not limited to the structure in FIG. 7. For example, the word line signal WL, the read select gate signal SG, and the program select gate signal VA can be generated from a common node physically contacted with a polycrystalline silicon layer. Further, as previous illustration, the first doped region Reg1 can be an N well. The second doped region Reg2 can be an N well. The third doped region Reg3 can be a P well. However, when a deep N well (DNW) process is introduced to form the memory cell 100, well type combinations of the first doped region Reg1 and the second doped region Reg2 can be modified. For example, the first doped region Reg1 and the second doped region Reg2 can be two respective N wells or P wells.

Figure 8:
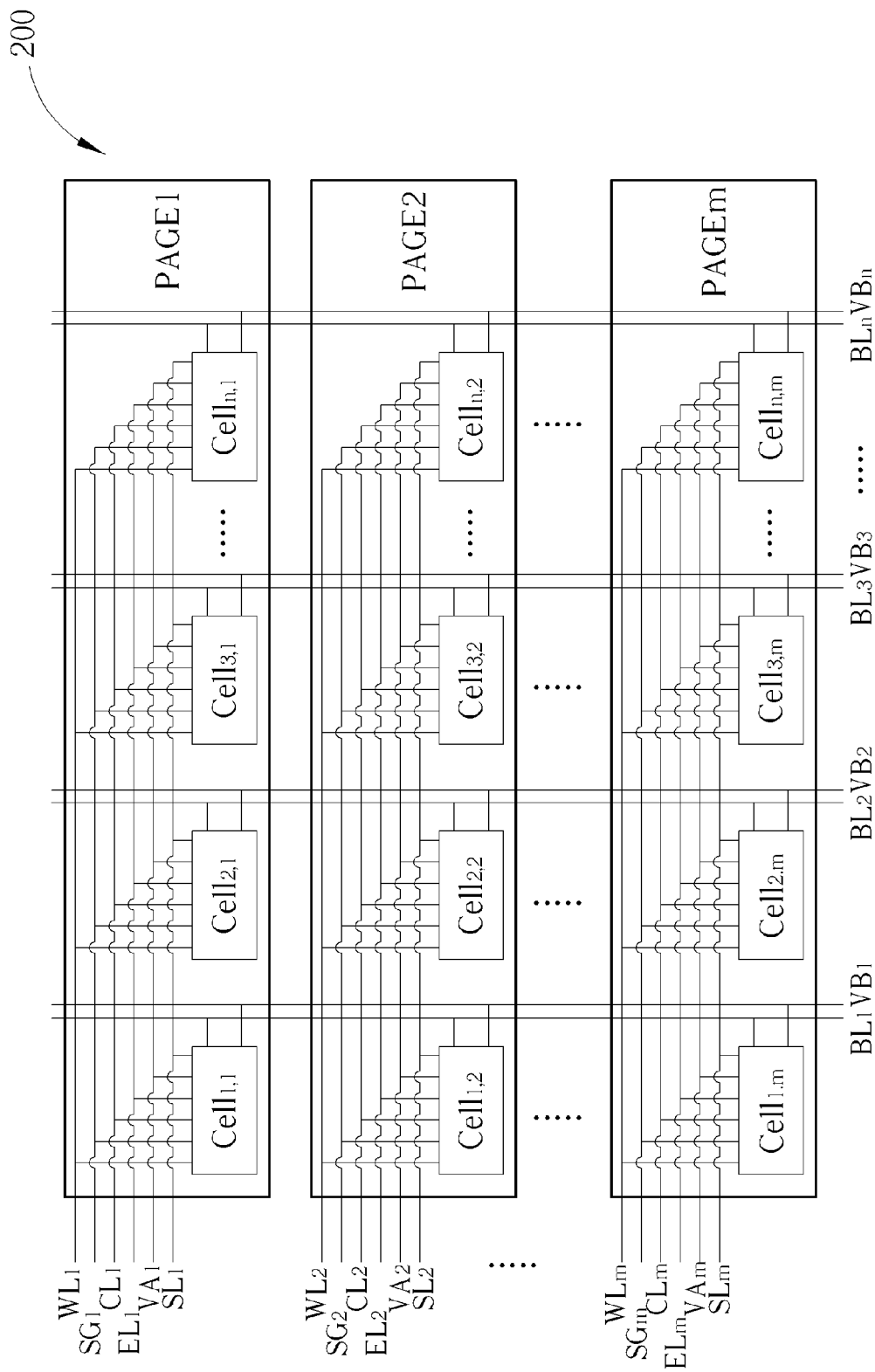
FIG. 8 illustrates a memory array according to an embodiment of the present invention.

FIG. 8 illustrates a memory array 200 including the memory cell 100. As aforementioned illustration, the memory cell 100 receives the word line signal WL, the read select gate signal SG, the program select gate signal VA, the control line signal CL, the erase line signal EL, the bit line signal BL, the read source line signal SL, and the program source line signal VB for performing various operations. Specifically, the word line signal WL, the read select gate signal SG, and the program select gate signal VA can be categorized to bear selection information. The control line signal CL and the erase line signal EL can be categorized to bear status control information. The bit line signal BL, the read source line signal SL, and the program source line signal VB can be categorized to bear address information. Here, the memory array 200 includes (n xm) memory cells, where n and m are two positive integers. The memory cells $Cell_{1,1}$ to $Cell_{1,m}$ form a first column of memory cells of the memory array 200. The memory cells $Cell_{2,1}$ to $Cell_{2,m}$ form a second column of memory cells of the memory array 200. The memory cells $Cell_{n,1}$ to $Cell_{n,m}$ form an $n^{th}$ column of memory cells of the memory array 200. Further, the memory cells $Cell_{1,1}$ to $Cell_{n,1}$ form a first row of memory cells of the memory array 200. A first page PAGE1 of the memory array 200 is defined to include the first row of memory cells. The memory cells $Cell_{1,2}$ to $Cell_{n,2}$ form a second row of memory cells of the memory array 200. A second page PAGE2 of the memory array 200 is defined to include the second row of memory cells. The memory cells $Cell_{1,m}$ to $Cell_{n,m}$ form an $m^{th}$ row of memory cells of the memory array 200. An $m^{th}$ page PAGEm of the memory array 200 is defined to include the $m^{th}$ row of memory cells. Particularly, when the memory array 200 includes a plurality of memory cells having structure of the memory cell 100, a word line $WL_1$ carrying the word line signal, a read selection gate line $SG_1$ carrying the read select gate signal, a program selection gate line $VA_1$ carrying the program select gate signal, a control line $CL_1$ carrying the control line signal, an erase line $EL_1$ carrying the erase line signal, a read source line $SL_1$ carrying the read source line signal are coupled to a row of memory cells such as $Cell_{1,1}$ to $Cell_{n,1}$ to form a page PAGE1 of the memory array 200. Additionally, a bit line $BL_1$ carrying the bit line signal and a program source line $VB_1$ carrying the program source line signal are coupled to a column of memory cells such as $Cell_{1,1}$ to $Cell_{1,m}$ of the memory array 200. Specifically, all columns and rows of the memory cells in the memory array 200 can follow the connections shown in FIG. 8.

In the memory array 200, page by page operation can be performed. For example, the first page PAGE1 can be selected to prepare program operation. At the moment, the second page PAGE2 to the $m^{th}$ page are unselected. Similarly, the first page PAGE1 can be selected to prepare read operation. At the moment, the second page PAGE2 to the $m^{th}$ page are unselected. For presentation completeness, all signals of the selected page and unselected page can be written in Table B.

TABLE B

| Page Status | CL | SL | SG | WL | BL | EL | VA | VB |
|---|---|---|---|---|---|---|---|---|
| PGM (page selected) | VPGM | VDD | VDD | VDD | VDD | VPGM | VDD | 0/VDD |
| PGM (page unselected) | 0 | 0 | 0 | 0 | VDD | 0 | 0 | 0/VDD |
| READ (page selected) | 0 | 0 | VG | VG | VBL/F | 0 | VG | 0 |
| READ (page unselected) | 0 | 0 | 0 | 0 | VBL/F | 0 | 0 | 0 |

Specifically, in programming status, for a selected page, two possible voltages of the program source line signal VB are introduced. As indicated to Table A, when a memory cell is driven to perform the program operation, the program source line signal VB is at the ground voltage. When the memory cell is driven to perform the program inhibition operation, the program source line signal VB is at a second voltage VDD. Thus, the program source line signal VB can be presented as "0/VDD" in Table B to correspond to the program operation or the program inhibition operation. As illustrated in FIG. 8, the program source line signal VB is received by a column of memory cells. In other words, memory cells coupled to a program selection line (for example, program selection line $VB_1$) corresponding to different pages are received a common program source line signal VB (0/VDD). As a result, voltage of the program source line signal VB under page unselected status is also represented as "0/VDD".

Further, in reading status, for a selected page, two possible voltages of the bit line signal BL are introduced. As indicated to Table A, when a selected memory cell is driven to perform the read operation, the bit line signal BL is at the fourth voltage VBL. When an unselected memory cell is driven to perform the read operation, the bit line signal BL is under the floating state. Thus, the bit line signal BL can be presented as "VBL/F" in Table B to correspond to the read operation for selected/unselected memory cell. As illustrated in FIG. 8, the bit line signal BL is received by a column of memory cells. In other words, memory cells coupled to a bit line (for example, bit line $BL_1$) corresponding to different pages are received a common bit line signal BL (VBL/F). As a result, voltage of the bit line signal BL under page unselected status is also represented as "VBL/F". Additionally, when the page unit is unselected, the control line signal CL, the read source line signal SL, the read select gate signal SG, the word line signal WL, the erase line signal EL, and the program select gate signal VA are at the ground voltage.

Figure 9:
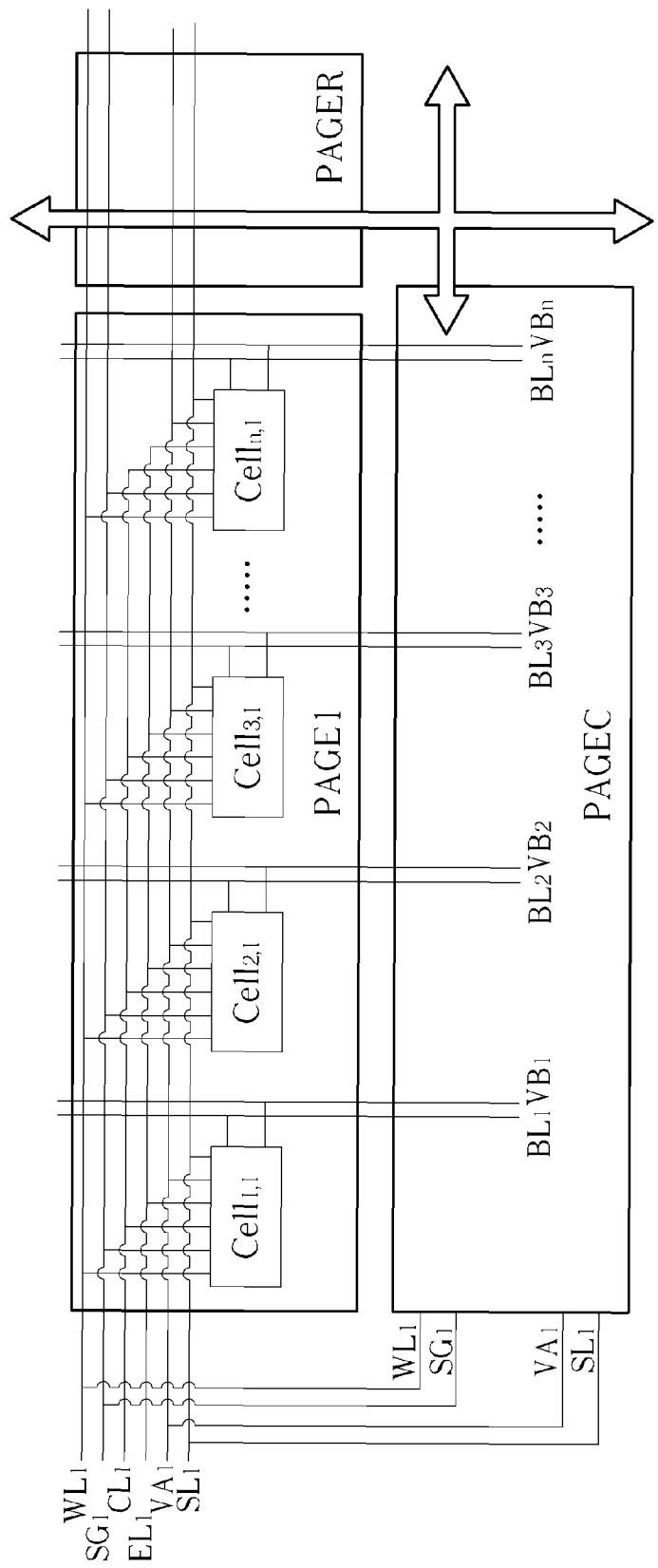
FIG. 9 illustrates a method for extending the memory array in FIG. 8.

FIG. 9 illustrates a method for extending the memory array 200. For presentation simplicity, a first page PAGE1 is introduced to the memory array 200. A row extended page PAGER and a column extended page PAGEC are also introduced for illustrating an extension method of the memory array 200. As shown in FIG. 9, for a row-direction based extension, when the row extended page PAGER is prepared to be combined with the first page PAGE1, memory cells of the first page PAGE1 and the row extended page PAGER are coupled to the word line $WL_1$, the read selection gate line $SG_1$, the program selection gate line $VA_1$, and the read source line $SL_1$. The control line $CL_1$ and the erase line $EL_1$ of the first page PAGE1 can be optionally coupled to memory cells of the row extended page PAGER. For a column-based extension, when the column extended page PAGEC is prepared to be combined with the first page PAGE1, memory cells of the first page PAGE1 and the column extended page PAGEC are coupled to the bit line $BL_1$ and the program source line $VB_1$ (i.e., the first column). Briefly, for the row-direction based extension, a row of memory cells can be coupled through the word line $WL_1$, the read selection gate line $SG_1$, the program selection gate line $VA_1$, and the read selection line $SL_1$. For the column-direction based extension, a column of memory cells can be coupled through the bit line $BL_1$ and the program source line $VB_1$. Similarly, another column of memory cells can be coupled through another bit line (such as bit line $BL_2$) and another program selection line (such as program selection line $VB_2$), and so on. Thus, the memory array 200 can be extended. Further, for the column-direction based extension, the word line $WL_1$, the read selection gate line $SG_1$, the program selection gate line $VA_1$, and the read selection line $SL_1$ can also be used for connecting the column of memory cells (i.e., the column of memory cells in different pages of PAGE1 and PAGEC).

To sum up, the present invention illustrates a memory cell. The memory cell can be operated to perform a programming function, a reading function, and an erasing function. Specifically, instead of using a common path, the memory cell of the present invention uses different program and read paths for achieving high endurance. In other words, high endurance of the memory cell can be achieved because the read transistor of the memory cell bears less stress during the program and the erase operation. Further, a method for extending the memory array is also illustrated. Some signals including selection information and address information can be used for connecting a row of memory cells. Some signals including address information can be used for connecting a column of memory cells. Thus, the memory cell of the present invention can increase the endurance and sensing margin. Further, memory cells can use a simple and flexible method to form a memory array with arbitrary size.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory cell comprising:
a coupling device comprising:
a first terminal configured to receive a control line signal; and
a second terminal;
a read transistor comprising:
a first terminal;
a control terminal coupled to the second terminal of the coupling device; and
a second terminal;
a first read selection transistor comprising:
a first terminal coupled to the second terminal of the read transistor;
a control terminal configured to receive a word line signal; and
a second terminal configured to receive a bit line signal;
a second read selection transistor comprising:
a first terminal configured to receive a read source line signal;
a control terminal configured to receive a read select gate signal; and
a second terminal coupled to the first terminal of the read transistor;
an erase device comprising:
a first terminal configured to receive an erase line signal; and
a second terminal coupled to the second terminal of the coupling device;
a program transistor comprising:
a first terminal; and
a control terminal coupled to the second terminal of the coupling device; and
a program selection transistor comprising:
a first terminal configured to receive a program source line signal;
a control terminal configured to receive a program select gate signal; and
a second terminal coupled to the first terminal of the program transistor.

2. The memory cell of claim 1, wherein the program transistor further comprises a second terminal kept floated.

3. The memory cell of claim 1, wherein the coupling device is formed on a first doped region and the erase device is formed on a second doped region.

4. The memory cell of claim 1, wherein the read transistor, the first read selection transistor, the second read selection transistor, the program transistor, and the program selection transistor are formed on a third doped region.

5. The memory cell of claim 1, wherein the read transistor and the program transistor are floating gate transistors, the coupling device and the erase device are MOS capacitors.

6. The memory cell of claim 1, the word line signal, the read select gate signal, and the program select gate signal are generated from a common node physically contacted with a polycrystalline silicon layer.

7. The memory cell of claim 1, wherein during a program operation of the memory cell, the first read selection transistor and the second read selection transistor are turned OFF.

8. The memory cell of claim 7, wherein the control line signal is at a first voltage, the read source line signal is at a second voltage, the read select gate signal is at the second voltage, the word line signal is at the second voltage, the bit line signal is at the second voltage, the erase line signal is at the first voltage, the program select gate signal is at the second voltage, the program source line signal is at a ground voltage, the first voltage is greater than the second voltage, and the second voltage is greater than the ground voltage.

9. The memory cell of claim 1, wherein during a program inhibition operation of the memory cell, the program selection transistor is turned OFF.

10. The memory cell of claim 9, wherein the control line signal is at a first voltage, the read source line signal is at a second voltage, the read select gate signal is at the second voltage, the word line signal is at the second voltage, the bit line signal is at the second voltage, the erase line signal is at the first voltage, the program select gate signal is at the second voltage, the program source line signal is at the second voltage, and the first voltage is greater than the second voltage.

11. The memory cell of claim 1, wherein during a read operation when the memory cell is selected, the control line signal is at a sixth voltage, the read source line signal is at the ground voltage, the read select gate signal is at a third voltage, the word line signal is at the third voltage, the bit line signal is at a fourth voltage, the erase line signal is at the sixth voltage, the program select gate signal is at the third voltage, the program source line signal is at the ground voltage, the third voltage and the fourth voltage are greater than the ground voltage, and the sixth voltage is equal to or greater than the ground voltage.

12. The memory cell of claim 1, wherein during a read operation when the memory cell is unselected, the control line signal is at a sixth voltage, the read source line signal is at the ground voltage, the read select gate signal is at a third voltage, the word line signal is at the third voltage, the bit line signal is at a seventh voltage or under a floating state, the erase line signal is at the sixth voltage, the program select gate signal is at the third voltage, the program source line signal is at the ground voltage, the third voltage is greater than the ground voltage, the sixth voltage is equal to or greater than the ground voltage, and the seventh voltage is equal to or in between the third voltage and the ground voltage.

13. The memory cell of claim 1, wherein during an erase operation of the memory cell, the control line signal is at a ground voltage, the read source line signal is at the ground voltage, the read select gate signal is at a second voltage, the word line signal is at the second voltage, the bit line signal is at the ground voltage, the erase line signal is at a fifth voltage, the program select gate signal is at the second voltage, the program source line signal is at the ground voltage, the fifth voltage is greater than the second voltage, and the second voltage is greater than the ground voltage.

14. The memory cell of claim 13, wherein the first read selection transistor, the second read selection transistor, and the program selection transistor are turned ON.

15. The memory cell of claim 1, wherein the second terminal of the coupling device is coupled to a common floating gate.

16. The memory cell of claim 15, wherein during a program operation of the memory cell, the first terminal of the coupling device receives a high voltage, the program selection transistor is turned ON, and electrical charges are ejected from the program transistor to the common floating gate.

17. The memory cell of claim 1, wherein a source/drain junction of the read transistor is coupled to a source/drain junction of the first read selection transistor or the second read selection transistor.

18. The memory cell of claim 1, wherein the second terminal of the erase device is coupled to a common floating gate.

19. The memory cell of claim 18, wherein during an erase operation of the memory cell, the first terminal of the erase device receives a high voltage and electrical charges are ejected from the common floating gate to the erase device.

20. The memory cell of claim 1, wherein a source/drain junction of the program transistor is coupled to a source/drain junction of the program selection transistor.

21. The memory cell of claim 1, wherein the word line signal, the read select gate signal, and the program select gate signal comprise selection information, the control line signal and the erase line signal comprise status control information, and the bit line signal, the read source line signal, and the program source line signal comprise address information.

22. The memory cell of claim 1, wherein a word line carrying the word line signal, a read selection gate line carrying the read select gate signal, a program selection gate line carrying the program select gate signal, a control line carrying the control line signal, an erase line carrying the erase line signal, a read source line carrying the read source line signal are coupled to a plurality of row memory cells to form a page unit of a memory array.

23. The memory cell of claim 22, wherein when the page unit is unselected, the control line signal, the read source line signal, the read select gate signal, the word line signal, the erase line signal, and the program select gate signal are at a ground voltage.

24. The memory cell of claim 22, wherein a plurality of bit lines carrying the bit line signals and a plurality of program source lines carrying the program source line signals are coupled to respective column memory cells of the memory array.

25. The memory cell of claim 1, wherein a bit line carrying the bit line signal and a program source line carrying the program source line signal are coupled to a plurality of column memory cells of a memory array.

* * * * *